(12) United States Patent
Ando et al.

(10) Patent No.: US 11,647,680 B2
(45) Date of Patent: May 9, 2023

(54) OXIDE-BASED RESISTIVE MEMORY HAVING A PLASMA-EXPOSED BOTTOM ELECTRODE

(71) Applicant: INTERNATIONAL BUSINESS MACHINES CORPORATION, Armonk, NY (US)

(72) Inventors: Takashi Ando, Eastchester, NY (US); Hiroyuki Miyazoe, White Plains, NY (US); Eduard Albert Cartier, New York, NY (US); Babar Khan, Ossining, NY (US); Youngseok Kim, Upper Saddle River, NJ (US); Dexin Kong, Guilderland, NY (US); Soon-Cheon Seo, Glenmont, NY (US); Joel P. De Souza, Putam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/898,527

(22) Filed: Jun. 11, 2020

(65) Prior Publication Data
US 2021/0391536 A1 Dec. 16, 2021

(51) Int. Cl.
*H01L 45/00* (2006.01)
*H01L 27/24* (2006.01)

(52) U.S. Cl.
CPC ...... *H01L 45/1641* (2013.01); *H01L 27/2463* (2013.01); *H01L 45/1233* (2013.01); *H01L 45/1253* (2013.01); *H01L 45/146* (2013.01); *H01L 45/1608* (2013.01)

(58) Field of Classification Search
CPC .......................... H01L 45/1641; H01L 45/1233
See application file for complete search history.

(56) References Cited

U.S. PATENT DOCUMENTS

| 8,599,601 | B2 | 12/2013 | Jo et al. |
| 9,847,378 | B2 | 12/2017 | Sheng et al. |
| 9,847,482 | B2 | 12/2017 | Cho |
| 9,997,703 | B2 | 6/2018 | Lam et al. |
| 10,297,749 | B1 | 5/2019 | Hashemi et al. |
| 10,700,124 | B1 * | 6/2020 | Yang ............... H01L 27/224 |

(Continued)

FOREIGN PATENT DOCUMENTS

| CN | 104518083 A | 4/2015 |
| WO | 2019066849 A1 | 4/2019 |

OTHER PUBLICATIONS

Liu et al., CF4 plasma treatment of tungsten bottom electrode of Cu/SiOx/W structure for resistive memory applications, Thin Solid Films 584 (2015) 326-329 (Year: 2015).*

(Continued)

*Primary Examiner* — Shih Tsun A Chou
(74) *Attorney, Agent, or Firm* — Cantor Colburn LLP; Jeffrey S. LaBaw

(57) ABSTRACT

Provided are embodiments for a semiconductor device. The semiconductor device includes a bottom electrode, wherein the bottom electrode is formed on a metal interconnect electrode, and a dielectric layer on a surface of the bottom electrode. The semiconductor device also includes a top electrode formed on a surface of the dielectric layer, wherein at least one of the top electrode or the bottom electrode is a plasma treated top electrode or plasma treated bottom electrode. Also provided are embodiments for a method of fabricating a resistive switching device where at least one of the plurality of layers of the memory stack is processed with a charge particle treatment.

13 Claims, 15 Drawing Sheets

(56) References Cited

U.S. PATENT DOCUMENTS

| | | |
|---|---|---|
| 2014/0048799 A1 | 2/2014 | Tour et al. |
| 2014/0225055 A1 | 8/2014 | Herner et al. |
| 2015/0318472 A1* | 11/2015 | Abdelmoula ....... H01L 45/1253 257/3 |
| 2018/0047898 A1 | 2/2018 | Ridgeway et al. |
| 2020/0203603 A1* | 6/2020 | Glassman ........... H01L 45/1253 |
| 2020/0227474 A1* | 7/2020 | O'Brien ................ H01L 43/14 |
| 2021/0098693 A1* | 4/2021 | Chuang ................ H01L 43/12 |

OTHER PUBLICATIONS

Meng Qi et al., Highly uniform switching of HfO2—x based RRAM achieved through Ar plasma treatment for low power and multilevel storage, Applied Surface Science 458 (2018) 216-221 (Year: 2018).*

Xue et al., "The effect of plasma treatment on reducing electroforming voltage of silicon oxide RRAM", ECS Transactions, 45 (6) 245-250 (2012).

Zhang et al., "Bipolar Resistive Switching Characteristics of HfO2/TiO2/HfO2 Trilayer-Structure RRAM Devices on Pt and TiN-Coated Substrates Fabricated by Atomic Layer Deposition", Nanoscale Research Letters (2017), 11 pages.

Electronic Materials Research Laboratory, "Redox-based Tera-bit memories," http://www.emrl.de/r_a_1.html (retrieved Jan. 3, 2018), 10 pages.

Wong et al., "Metal-Oxide RRAM," Proceedings of the IEEE, vol. 100, No. 6, Jun. 2012, pp. 1951-1970.

Wu et al., "Fundamental limitations of existing models and future solutions for dielectric reliability and RRAM applications." 2017 IEEE International Electron Devices Meeting (IEDM). IEEE, 2017, pp. 21.5.1-21.5.4.

* cited by examiner

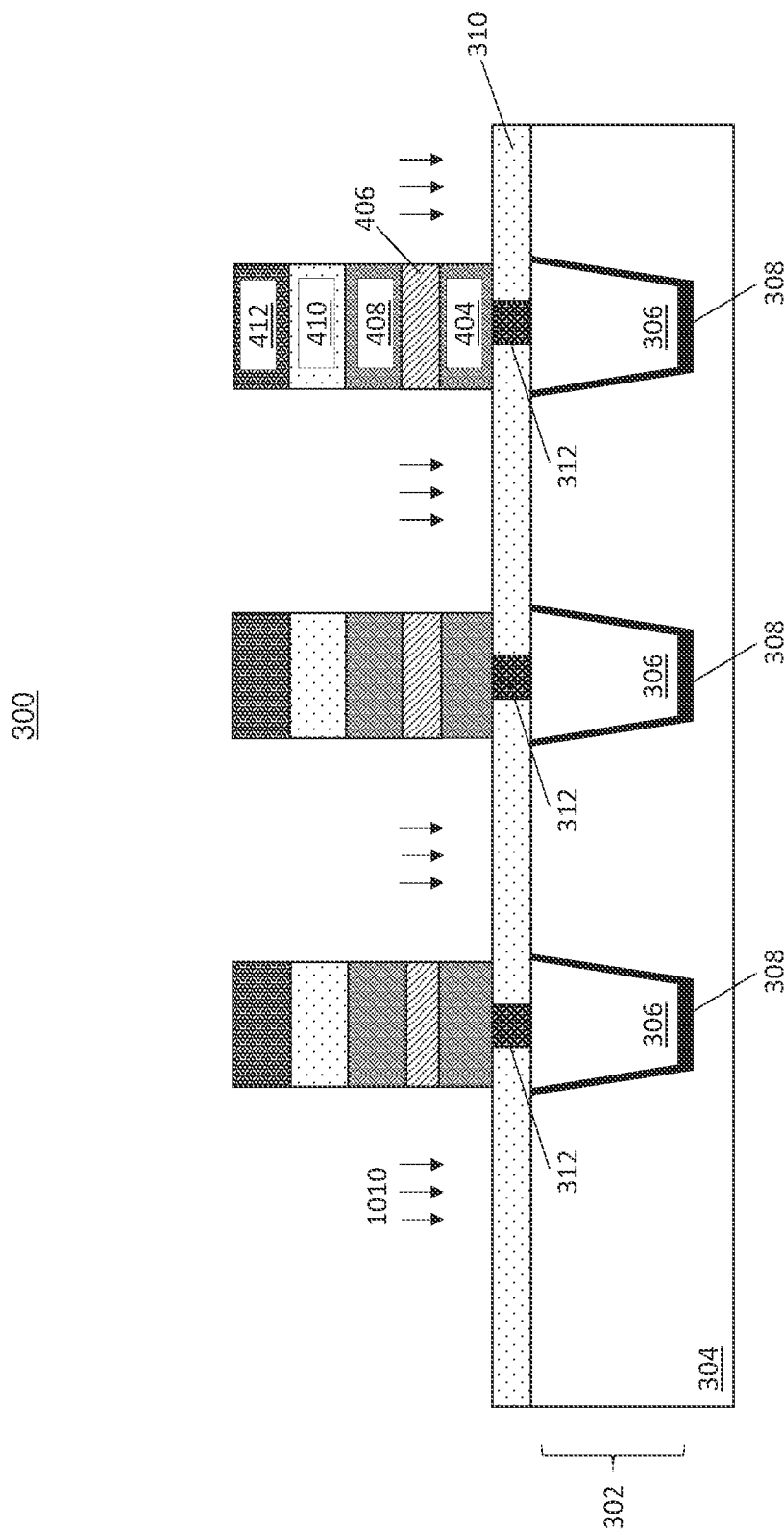

OXIDE-BASED RESISTIVE MEMORY HAVING A PLASMA-EXPOSED BOTTOM ELECTRODE

BACKGROUND

The present invention generally relates to fabrication methods and resulting structures for semiconductor devices. More specifically, the present invention relates to fabrication methods and resulting structures for an oxide-based resistive memory device (e.g., resistive random access memory (RRAM)) having a plasma-exposed bottom electrode.

As the functionality of integrated chips increases, the need for more memory does as well. For example, analog memory devices (e.g., RRAMs) are now being used to build neuromorphic hardware accelerators for deep learning (AI) applications. In response, designers have been looking to decrease the size of the memory elements and to stack more memory elements in a unit area to achieve greater capacity and lower costs per bit. With advancements in lithographic techniques, significant shrinkage of memory elements has been achieved. For example, flash memory can achieve high density by using three-dimensional (3D) arrays, such as using vertical NAND cell stacking. Due to its high density, flash memory has been widely used as a large-capacity, nonvolatile memory, which can store data when it is powered off. However, it has been found that further miniaturization of the flash memory is limited as production costs have become increasingly high.

Designers are now looking at next generation nonvolatile memories such as MRAMs (Magnetoresistive Random Access Memory), PCRAMs (Phase Change Random Access Memory), CBRAMs (Conductive Bridging Random Access Memory) and RRAMs (Resistive Random Access Memory), to increase writing speed and decrease power consumption. Among the nonvolatile memories, RRAM has the most potential to replace flash memories due to its simple structure, simple crossbar array, and suitability to low-temperature fabrication. A unit element of the RRAM is a two-terminal resistive memory device composed of only an insulator (e.g., a memristor element (e.g., $HfO_x$)) positioned between two metal electrodes. Oxygen vacancies are intentionally introduced in the memristor film so that the memristor can be programmed to different logic states, such as a low-resistance state (logic "1") or a high-resistance state (logic "0"), by changing the polarity of an electrical field across the memristor element.

SUMMARY

Embodiments of the present invention are directed to a method for fabricating a resistive switching device. A non-limiting example of the method includes forming a metal interconnect electrode; forming a memory stack comprising a plurality of layers, wherein the plurality of layers includes a top electrode, a bottom electrode, and a dielectric layer between the top electrode and the bottom electrode; and performing a charge particle treatment on at least one of the plurality of layers of the memory stack.

Embodiments of the present invention are directed to a method of fabricating a resistive switching device. A non-limiting example of the method includes forming a bottom electrode; forming a memory stack comprising a plurality of layers, wherein the plurality of layers includes a top electrode, a bottom electrode, and a dielectric layer between the top electrode and the bottom electrode; performing a charge particle treatment on at least one of the plurality of layers of the memory stack; and forming a spacer on a sidewall of at least a portion of the memory stack, wherein the spacer prevents a short between the top electrode and the bottom electrode.

Embodiments of the invention are directed to a semiconductor device. A non-limiting example of the semiconductor device includes a bottom electrode, wherein the bottom electrode is formed on a metal interconnect electrode; a dielectric layer on a surface of the bottom electrode; and a top electrode on a surface of the dielectric layer, wherein at least one of the top electrode or the bottom electrode is a plasma treated top electrode or plasma treated bottom electrode.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3-13 depict views of a section of a substrate/wafer after various fabrication operations for forming RSD structures according to embodiments of the invention, in which:

FIG. 3 depicts a cross-sectional view of the RSD structures after fabrication operations according to embodiments of the invention;

FIG. 4 depicts a cross-sectional view of the RSD structures after fabrication operations according to embodiments of the invention;

FIG. 5 depicts a cross-sectional view of the RSD structures after fabrication operations according to embodiments of the invention; and FIG. 6 depicts a cross-sectional view of the RSD structures after fabrication operations according to embodiments of the invention;

FIG. 7 depicts a cross-sectional view of the RSD structures after fabrication operations according to embodiments of the invention;

FIG. 8 depicts a cross-sectional view of the RSD structures after fabrication operations according to embodiments of the invention;

FIG. 10 depicts a cross-sectional view of the RSD structures after fabrication operations according to embodiments of the invention;

FIG. 11 depicts a cross-sectional view of the RSD structures after fabrication operations according to embodiments of the invention;

FIG. 12 depicts a cross-sectional view of the RSD structures after fabrication operations according to embodiments of the invention;

FIG. 13 depicts a cross-sectional view of the RSD structures after fabrication operations according to embodiments of the invention.

Figure 1B:
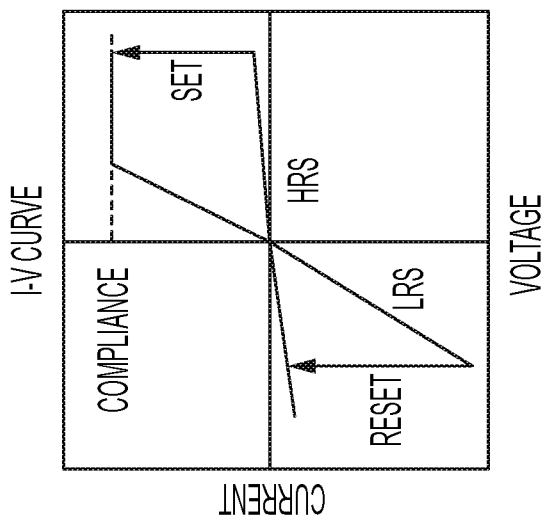
FIG. 1B depicts a diagram of an I-V curve illustrating the switching operation of the RSD component shown in FIG. 1A.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. RRAM is a high speed, high density, and low fabrication-cost nonvolatile memory (NVM) technology. Thus, RRAM has the potential to replace and/or complement the limited scaling of flash memories and other silicon-based memories such as dynamic random access memory (DRAM) and static random access memory (SRAM).

A typical RRAM storage cell is a two-terminal device formed as a metal-insulator-metal (MIM) structure, which is a simpler construction than the three terminal storage cells used in conventional CMOS-based DRAM or flash memory. The insulator material in the MIM device can be a binary metal oxide, which makes fabricating a MIM RRAM storage cell compatible with silicon-based CMOS fabrication process. The resistance of a RRAM storage cell serves as the switchable conduction state that stores data. When a sufficient electrical field/signal (i.e., a forming voltage) is applied across the metal electrodes of a MIM, the resistance of the insulator can be switched from one resistance state to another through various mechanisms, including the formation and rupture of one-dimensional conductive filaments formed in the metal oxide during electroforming. The formation and rupture of the conducting filaments involves various reduction-oxidation (redox) reactions and depends on the metal/electrode material. The oxygen vacancy concentration (Vo) in the oxide of the binary metal oxide and the state of the insulator/electrode interface are significant factors in controlling the resistive switching mechanism in a MIM memory cell. Thus, it is desirable to use insulators in the form of oxides with a high mobility of oxygen vacancies, examples of which include, for example, single-layer non-stoichiometric or double-layer oxide structures with ionic bonding. The insulator can be a resistive switching element stack that includes a metal oxide and a reactive electrode. Oxygen vacancy formation in the filament region can be enhanced and controlled by interactions between the metal oxide and the reactive electrode.

As next generation nonvolatile memories such as the RRAM continue to scale, device tolerances and critical dimensions continue to shrink. Higher forming voltages are required for smaller RRAM device sizes. The RRAM forming voltages at sub-um dimensions are typically 2V and increase as the dimensions are scaled. The electroforming of oxide RRAM or CBRAM is similar to dielectric breakdown. Dielectric breakdown occurs when current flow through an electrical insulator. Thus, another definition of the previously-described forming voltage is the voltage at which the electrical insulator becomes a conductor. However, MOSFETs are typically used to apply the forming voltages (or write voltages) to the resistive memory cells, and higher forming voltages cannot be supported by MOSFETs in existing CMOS technologies.

Turning now to an overview of aspects of the present invention, one or more embodiments of the invention address the above-described shortcomings of the prior art by providing a new RRAM semiconductor structure and a method for forming an RRAM device with a plasma treated electrode of an RRAM stack. More specifically, embodiments of the invention utilize a plasma exposure process to reduce the forming voltage during the RRAM stack patterning using a very large ratio between the size of the metal interconnect electrode and the RRAM stack. In some embodiments of the invention, the ratio between the metal interconnect electrode and the RRAM stack can be greater than 1000. The current conducting filaments are formed by the electron charging process instead of the electroforming via drive currents of the MOSFET which enables further scaling of the semiconductor devices. In embodiments of the invention, the method can include performing a charged particle treatment of a top electrode or a bottom electrode of an RRAM stack, where the RRAM stack is formed on the metal interconnect electrode. By performing the charged particle treatment of the top electrode or bottom electrode of the RRAM stack enables the scaling of the memory elements.

Figure 1A:
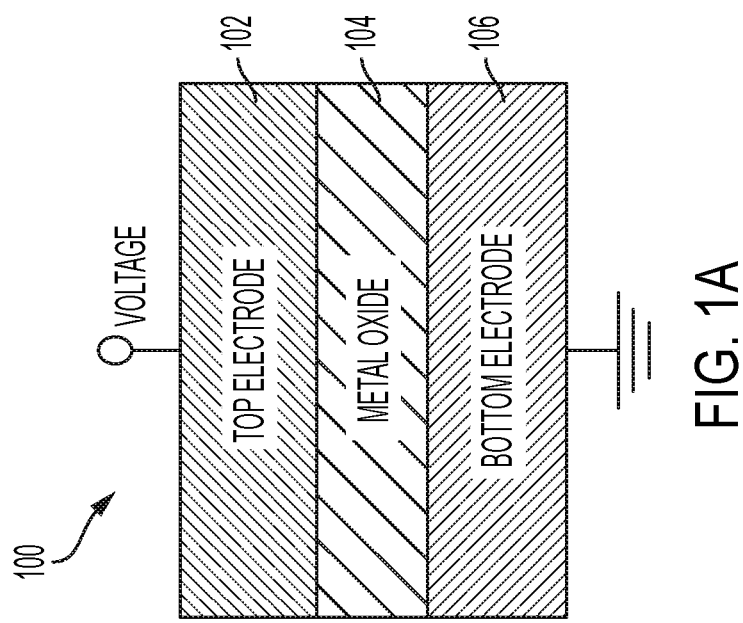
FIG. 1A depicts a simplified block diagram illustrating a cross-sectional view of a two-terminal resistive switching device (RSD), which can be used as a storage cell of an RRAM structure capable of incorporating aspects of the invention.

Turning now to a more detailed description of aspects of the present invention, FIG. 1A depicts a simplified block diagram illustrating a cross-sectional view of a two-terminal RSD component, which can be used as a storage cell of an RRAM structure (e.g., crossbar array 200 shown in FIG. 2) capable of incorporating aspects of the invention. The RSD storage cell 100 includes a top electrode 102, metal oxide 104 active region, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is canceled, which indicates the nonvolatile nature of RRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process (which programs the device to a particular logic state) and the RESET process (which clears the logic state which may have been previously programmed), the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of the current conducting filament (CF) and the corresponding LRS resistance value.

Figure 2:
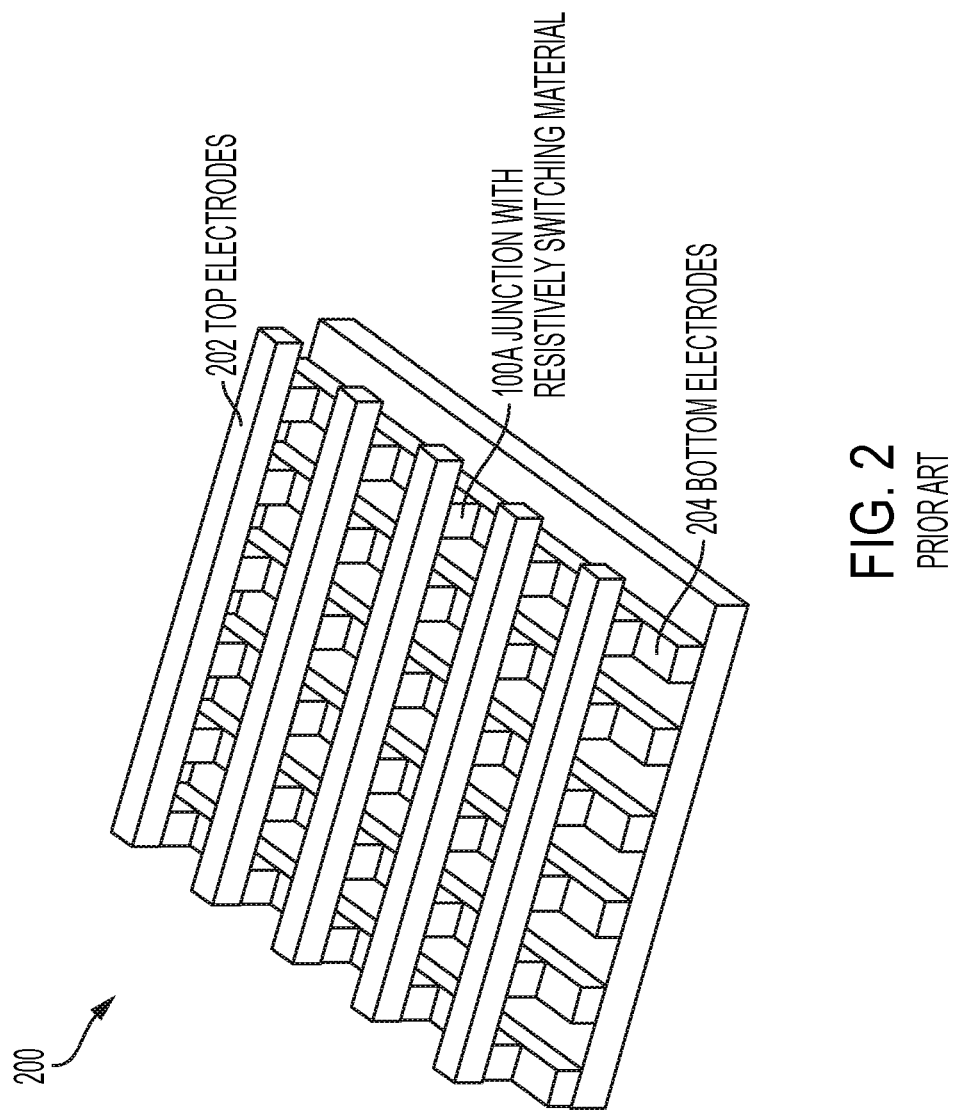
FIG. 2 depicts a simplified block diagram illustrating how the RSD component shown in FIG. 1A can be utilized as an addressable RRAM cell of an RRAM crossbar array capable of incorporating aspects of the invention.

Because RSD storage cell 100 uses only two external terminals, these memories can be accommodated in a crossbar array 200, which is shown in FIG. 2. The crossbar array 200 illustrates how the RSD storage cell 100 shown in FIG. 1A can be utilized as an addressable cross-point memory/storage cell 100A of the crossbar array 200, which is capable of incorporating aspects of the invention. The array 200 includes perpendicular conductive top electrode lines 202 (e.g., wordline rows), conductive bottom electrode lines 204 (e.g., bitline columns), and resistive switching element memory/storage cells 100A at the intersection between each top electrode line 202 and bottom electrode line 204. Contact liners/metals can be used to couple the resistive switching element memory/storage cell 100A to the top and bottom electrode lines 202, 204. The storage cell 100A and electrode lines 202, 204 can be configured to operate the same as the storage cell 100 shown in FIG. 1A. Each storage cell 100A can be accessed for read and write by using transistors (not shown) to bias the corresponding top electrode line 202 and bottom electrode line 204.

The crossbar array 200 is compatible with a variety of electronic circuits and devices, including ultra-high density NVM and artificial neural network (ANN) architectures. In neuromorphic computing applications (e.g., ANN), the RSD 100, 100A can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of RRAMs, which naturally expresses a fully-connected neural network.

Figure 3:
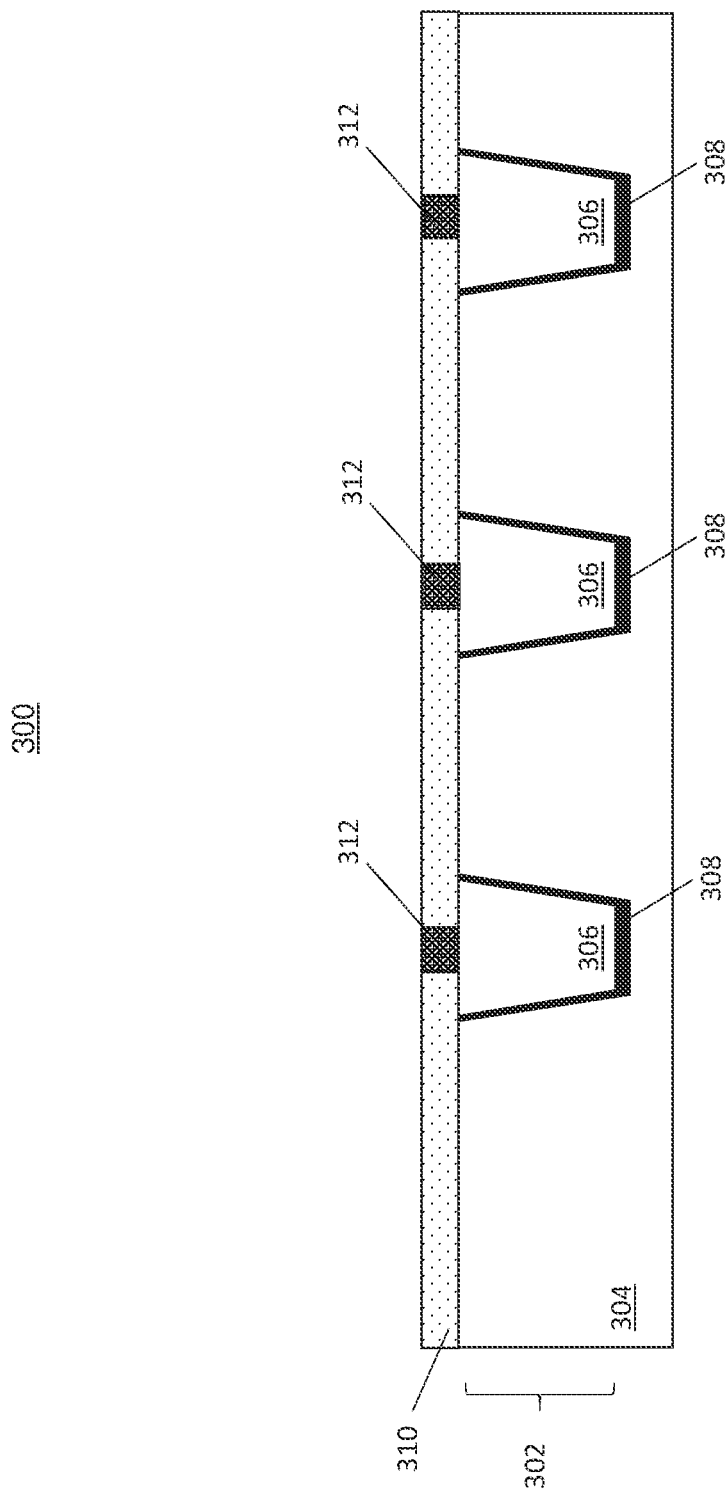

FIGS. 3-13 depict views of a portion of an IC wafer structure 300 after various fabrication operations in accordance with one or more embodiments of the invention. FIG. 3 depicts a cross-sectional view of the structure 300 after an initial set of fabrication operations according to embodiments of the invention. In the embodiment shown in FIG. 3, the wafer structure 300 includes a metal interconnect layer 302 formed in an inter-level dielectric (ILD) layer 304.

In some embodiments of the invention, the ILD layer 304 is a layer positioned within a back-end-of-line (BEOL) metallization stack (not depicted) of the wafer 300. The ILD layer 304 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the ILD layer 304 can be utilized, such as, for example, chemical vapor deposition (CVD), plasma-enhanced CVD (PECVD), atomic layer deposition (ALD), flowable CVD, spin-on dielectrics, or physical vapor deposition (PVD).

In some embodiments of the invention, the metal interconnect layer 302 includes one or more contacts or lines 306. The contacts or lines 306 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contacts or lines 306 include copper, cobalt, or tungsten. The conductive material can further include dopants that are incorporated during or after deposition. In some embodiments of the invention, the contacts or lines 306 can include a barrier metal liner 308. Material examples include tantalum nitride and tantalum (TaN and Ta), titanium, titanium nitride, cobalt, ruthenium, and manganese. In some embodiments of the invention, the metal interconnect layer 302 includes one of a plurality of metal interconnect layers disposed between a bottom electrode 404 (shown n FIG. 4) and an underlying semiconductor substrate (not shown). Still referring to FIG. 3, the metal interconnect electrode 312 has been formed in the inter-level layer 310. Material examples include silicon nitride (SiN) or NBLOK cap layer. In one or more embodiments of the invention, the metal interconnect electrode 312 can be the same size or large than the other features of the device. The size of the metal interconnect electrode 312 impacts the ability to RIE features above the metal interconnect electrode 312 to land on one material in order to provide good selectivity.

Figure 4:
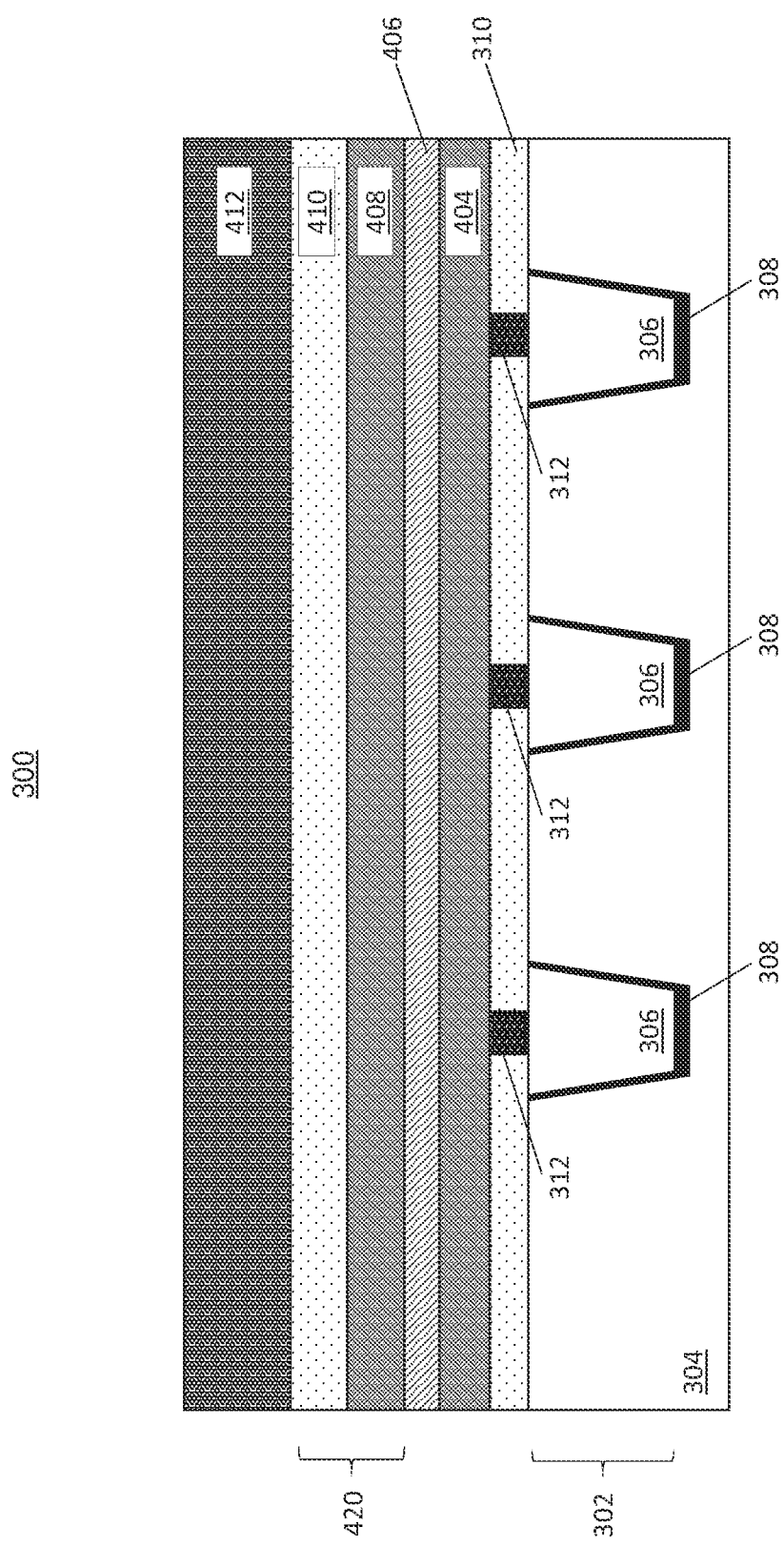

FIG. 4 depicts a cross-sectional view of the structure 300 after fabrication operations according to embodiments of the invention. In some embodiments of the invention, the bottom electrode 404 is formed on a surface of the inter-level layer 310 and the metal interconnect electrode 312. The bottom electrode 404 can include, for example, a metal nitride (e.g., titanium nitride (TiN) or tantalum nitride (TaN)) or a metal (e.g., titanium (Ti) or tantalum (Ta)). In some embodiments of the invention, the bottom electrode 404 includes TiN. In some embodiments of the invention, the bottom electrode 404 is formed to a thickness of 20 nm, although other thicknesses are within the contemplated scope of the invention.

In some embodiments of the invention, a dielectric layer 406 (also referred to as a dielectric data storage layer) is formed on a surface of the bottom electrode 404. The dielectric layer 406 can include a variable resistance. For example, depending on an applied voltage, the dielectric layer 406 can undergo a reversible change between a high resistance state associated with a first data state (e.g., a '0') and a low resistance state associated with a second data state (e.g., a '1'). In some embodiments of the invention, a voltage applied to the dielectric layer 406 will induce conductive paths (e.g., oxygen vacancies) to form across the dielectric layer 406, thereby reducing the resistance of the dielectric layer 406.

In some embodiments of the invention, the dielectric layer 406 can include a high-k dielectric material having a variable resistance. For example, in some embodiments of the invention, the dielectric layer 406 can include hafnium oxide ($HfO_x$), zirconium oxide ($ZrO_x$), aluminum oxide ($AlO_x$), nickel oxide ($NiO_x$) tantalum oxide ($TaO_x$), or titanium oxide ($TiO_x$). In some embodiments of the invention, the dielectric layer 406 includes a metal such as titanium (Ti), hafnium (Hf), platinum (Pt), ruthenium (Ru), and/or aluminum (Al). In other embodiments of the invention, the dielectric layer 406 includes a metal oxide such as titanium oxide ($TiO_x$), hafnium oxide ($HfO_x$), zirconium oxide ($ZrO_x$), germanium oxide ($GeO_x$), and cerium oxide ($CeO_x$). In some embodiments of the invention, the dielectric layer 406 is formed to a thickness of 2-100 nm, although other thicknesses are within the contemplated scope of the invention.

In some embodiments of the invention, a capping layer (not depicted) can be disposed over the dielectric layer 406. The capping layer can be configured to store oxygen, which can facilitate resistance changes within the dielectric layer 406. In some embodiments of the invention, the capping layer includes a metal or a metal oxide that is relatively low in oxygen concentration.

In some embodiments of the invention, a top electrode 420 is formed on a surface of the dielectric layer 406. In one or more embodiments of the invention, the top electrode 420 is a dual layer top electrode and includes a first layer 408 and a second layer 410. The first layer 408 of the top electrode 420 can include, for example, a metal nitride (e.g., titanium nitride or tantalum nitride) or a metal (e.g., titanium or tantalum). In some embodiments of the invention, the first layer 408 of the top electrode 420 includes titanium nitride.

In some embodiments of the invention, the first layer 408 of the top electrode 420 and the bottom electrode 404 are made of a same metal or metal nitride. In some embodiments of the invention, the first layer 408 of the top electrode 420 is made of a first metal or metal nitride and the bottom electrode 404 is made of a second metal or metal nitride. In some embodiments of the invention, the first layer 408 of the top electrode 420 is formed to a thickness of 5-100 nm, although other thicknesses are within the contemplated scope of the invention.

In some embodiments of the invention, a second layer 410 of the top electrode 410 is formed on a surface of the first layer of the top electrode 420. In some embodiments of the invention, the second layer 410 of the top electrode 420 includes tantalum nitride (TaN). In one or more embodiments of the invention, the thickness of the second layer 410 of the top electrode 420 can be in the range of 5-100 nm.

In some embodiments of the invention, a hard mask 412 is formed over the second layer 410 of the top electrode 420. The hard mask 412 can include an oxygen containing layer, such as a silicon-oxide ($SiO_2$) layer or silicon-oxynitride (SiON) layer, a layer that is substantially devoid of oxygen, such as a silicon-nitride (SiN) layer or a silicon-carbide (SiC) layer, or a composite dielectric film that is substantially devoid of oxygen. In some embodiments of the invention, the hard mask 412 is formed to a thickness of 40 nm, although other thicknesses are within the contemplated scope of the invention.

The bottom electrode 404, the dielectric layer 406, and the first layer 408 and second layer 410 of the top electrode 420, together define a memory stack (e.g., an RRAM stack). In one or more embodiments of the invention, the bottom electrode 404 can correspond to the bottom electrode 106 of FIG. 1A, the dielectric layer 406 can correspond to the metal oxide 104, and the top electrode 420 can correspond to the top electrode 102. In some embodiments of the invention, the memory stack is a SiN/TaN/TiN/$HfO_2$/TiN stack, with SiN being the topmost layer and TiN being the bottommost layer.

Figure 5:
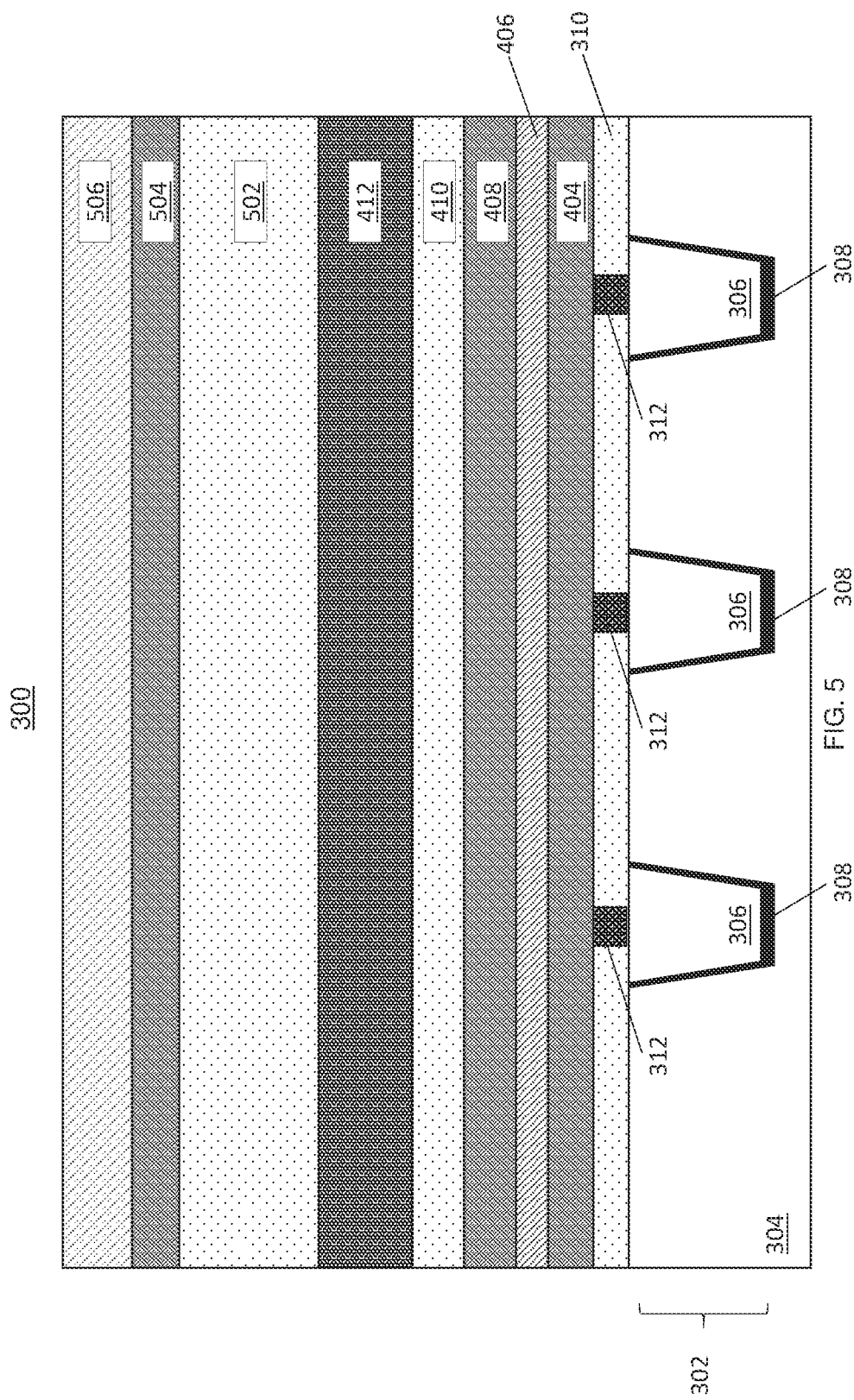

FIG. 5 depicts a cross-sectional view of the wafer structure 300 after a fabrication operations according to one or more embodiments of the invention. As illustrated in FIG. 5, a patterning film stack can be formed over the hard mask 412. In some embodiments of the invention, the film stack is a bi-layer stack, a tri-layer stack, or a multilayer stack having a topmost photoresist layer.

As depicted in FIG. 5, the film stack is a tri-layer stack having an organic planarization layer (OPL) 502, an anti-reflective coating 504, and a photoresist 506. Patterning film stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The OPL 502 can be formed over a surface of the hard mask 412. In some embodiments of the invention, the OPL 502 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 502 can include any organic polymer and a photo-active compound having a molecular structure that can attach to the molecular structure of the organic polymer. In some embodiments of the invention, the OPL 502 material is selected to be compatible with the overlying antireflective coating 504, the overlying photoresist 506, and the lithographic wavelength employed (i.e., ArF, KrF, etc.). In some embodiments, the OPL 502 can be applied using, for example, spin coating technology.

The antireflective coating 504 can be made of any suitable antireflective material, such as, for example, a low temperature oxide (LTO), SiARC, TiARC, or SiON. In some embodiments of the invention, the antireflective coating 504 is SiARC. The antireflective coating 504 can be deposited using, for example, a spin-on process. In some embodiments of the invention, the antireflective coating 504 is deposited to a thickness of about 0.5 to about 100 nm, although other thicknesses are within the contemplated scope of the invention.

The photoresist 506 can include any suitable photoresist material, such as, for example, 248 nm resists, 193 nm resists, 157 nm resists, or EUV (extreme ultraviolet) resists. In some embodiments of the invention, the photoresist 506 can be made of a light sensitive polymer, and can be deposited using any suitable resist process, such as spin-on coating.

Figure 6:
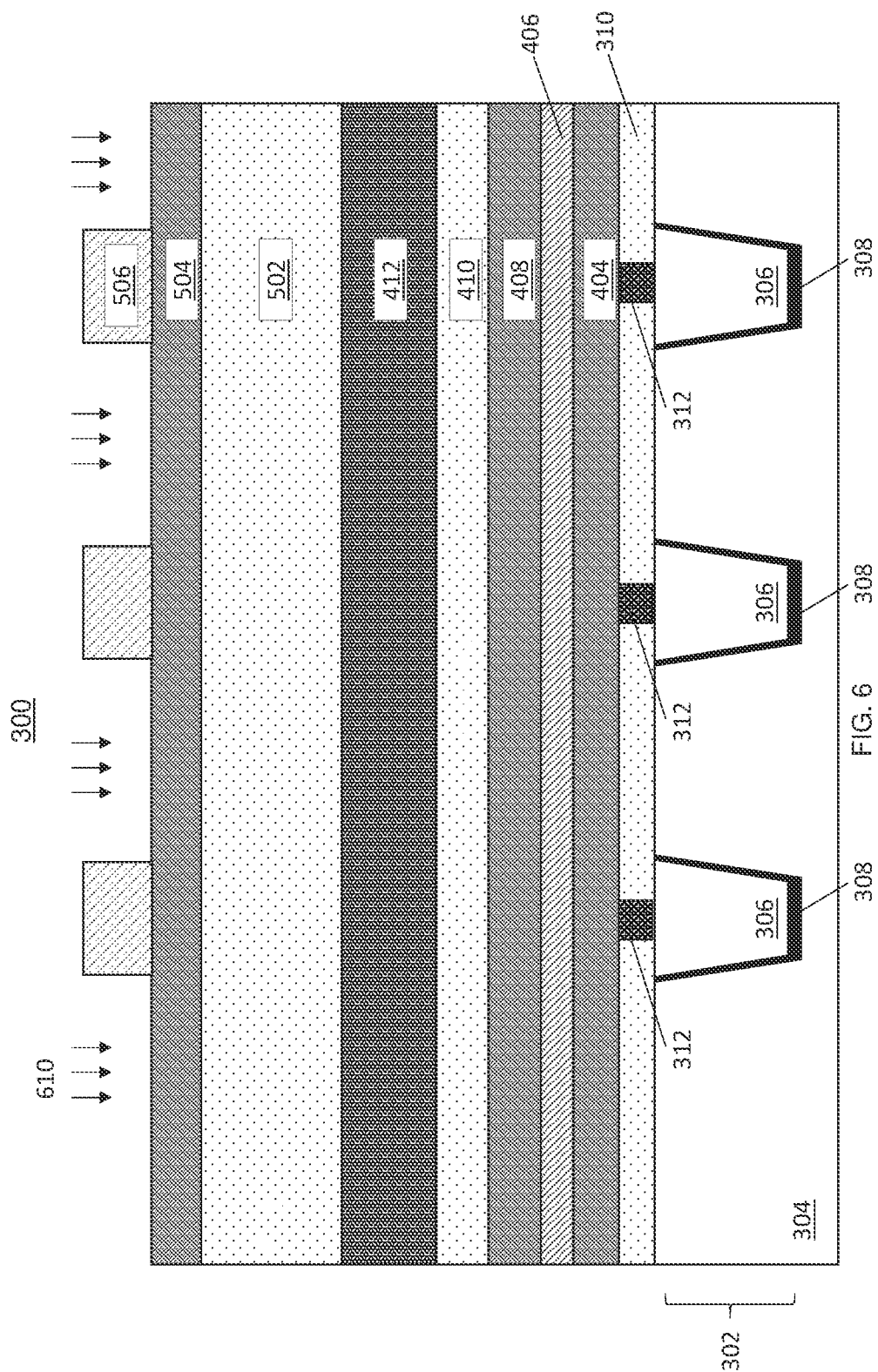

FIG. 6 depicts a cross-sectional view of the wafer structure 300 after fabrication operations according to one or more embodiments of the invention. As illustrated in FIG. 6, the photoresist 506 can be patterned (opened) to expose a surface of the antireflective coating 504.

The photoresist 506 can be opened using any suitable process (etch process represented by arrows 610), for example, by exposure to a photo-lithography system developing solvent. The opening in the photoresist 506 defines an RRAM pillar processing window. This processing window defines the portions of the memory stack that will be removed. In other words, the portions of the photoresist 506 that remain after opening the photoresist 506 define the widths of the subsequently formed RRAM elements (see for example, FIGS. 10 and 13).

Figure 7:
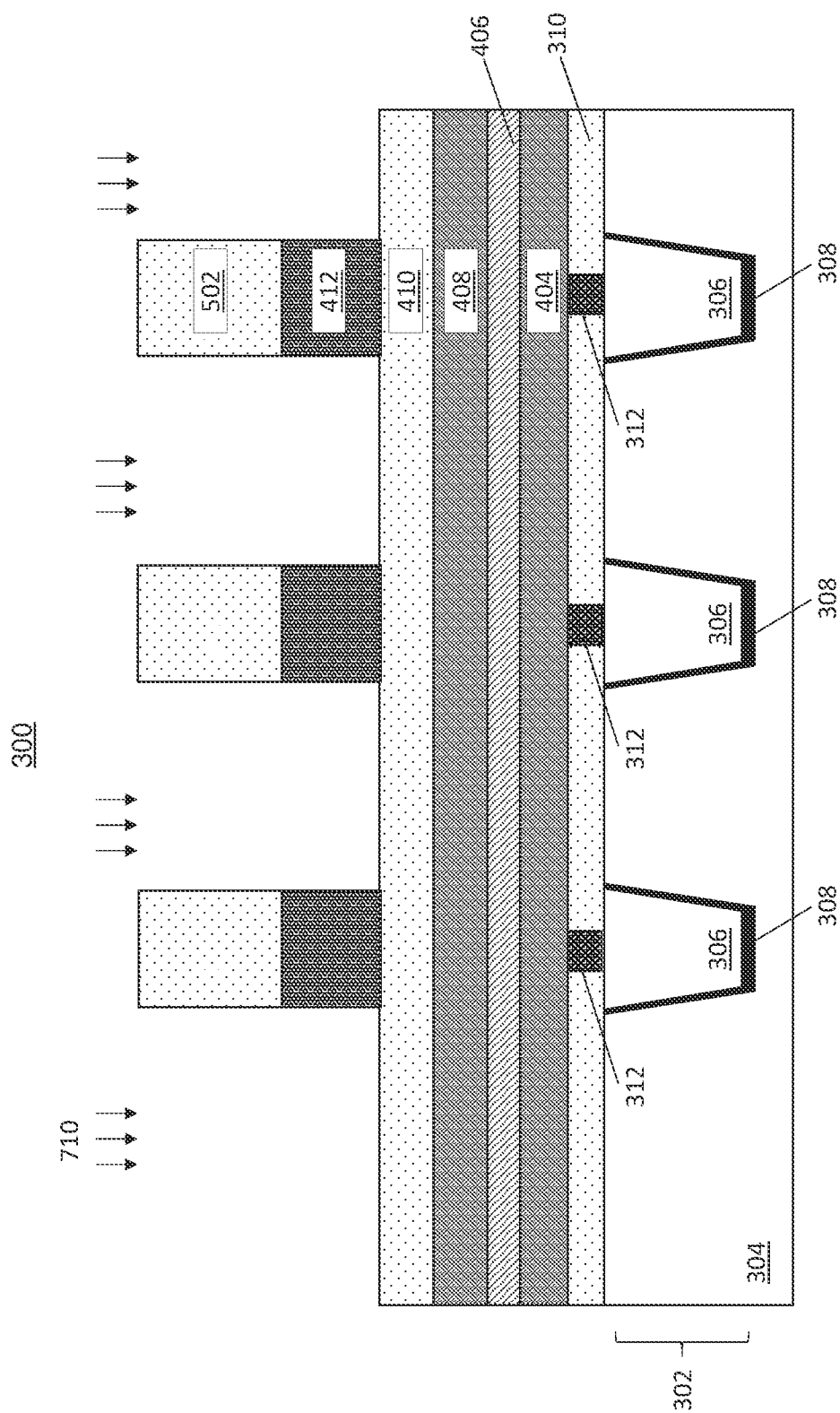

FIG. 7 depicts a cross-sectional view of the wafer structure 300 after fabrication operations according to one or more embodiments of the invention. As illustrated in FIG. 4, the pattern in the photoresist 506 can be transferred to the underlying antireflective coating 504 using, for example, a dry etch process (etch process represented by arrows 710).

The pattern in the antireflective coating 504 can be transferred to the underlying OPL 502 using, for example, a wet etch, a dry etch, or a combination of wet and/or dry etches. In some embodiments of the invention, the OPL 502 is patterned using a ME. In some embodiments of the invention, the photoresist 506 is removed during this OPL etch process. In some embodiments of the invention, the photoresist 506 can be removed or partially removed using an ashing process.

As further depicted in FIG. 7, the pattern can be transferred to the hard mask 412. This process is sometimes referred to as the hard mask open, and can include a wet etch process, a dry etch process, or a combination thereof. In some embodiments of the invention, the hard mask 412 is patterned using a RIE. In some embodiments of the invention, a thickness of the hard mask 412, and the corresponding hard mask open thermal budget, is defined such that the antireflective coating 504 can be completely removed during the hard mask open without recessing the underlying second layer 410 of the top electrode 420. In other words, the hard mask open can be tuned to land softly on the second layer 410 of the top electrode 420 (e.g., softly on TaN).

Figure 8:
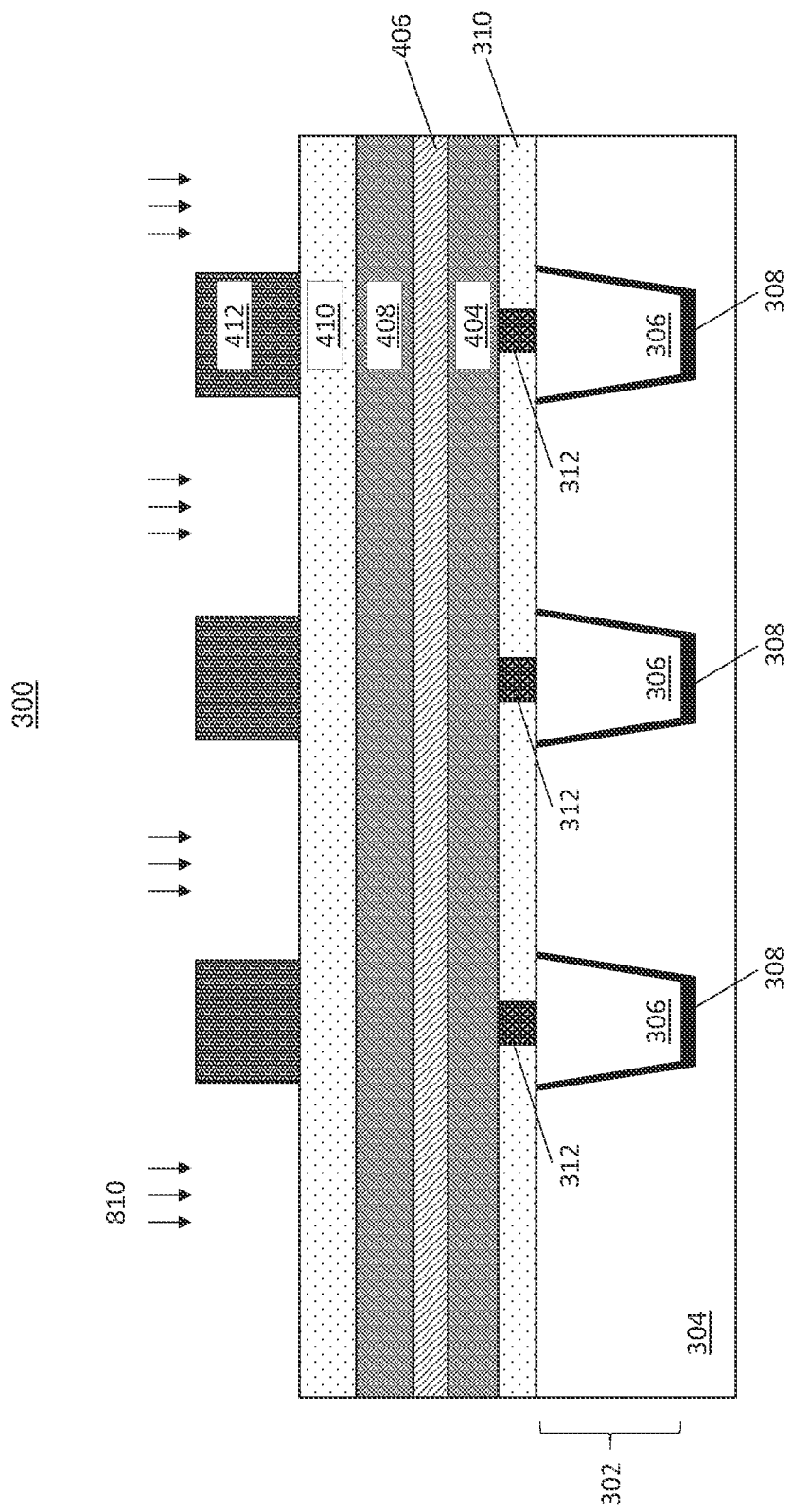

FIG. 8 depicts a cross-sectional view of the wafer structure 300 after fabrication operations according to one or more embodiments of the invention. As illustrated in FIG. 8, the OPL 502 can be removed following the hard mask open. The OPL 502 can be removed using, for example, a dry removal process, such as a RIE or plasma ash (represented by arrows 810). In some embodiments of the invention, the OPL 502 is removed using an oxygen-based ashing process. In some embodiments of the invention, the OPL 502 is removed using a nitrogen and hydrogen ($N_2/H_2$) based ashing process.

Figure 9A:
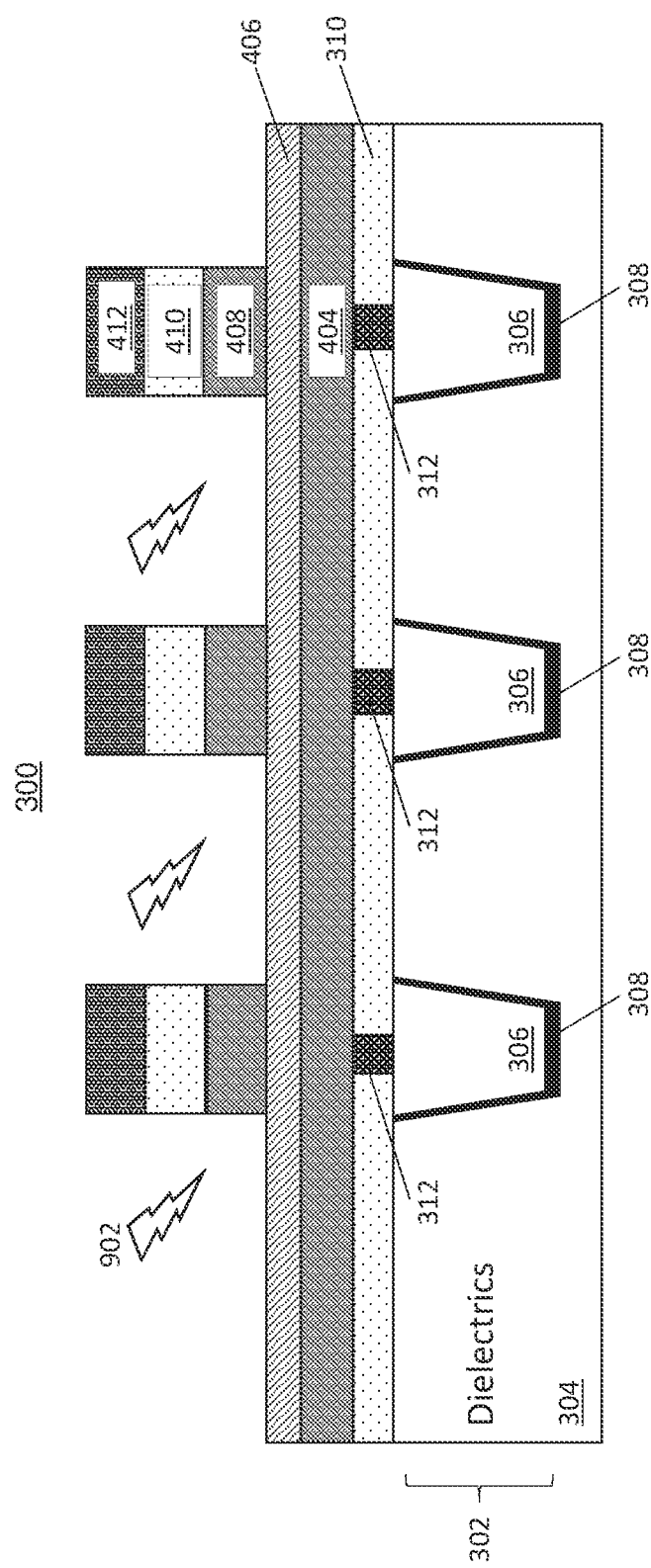
FIG. 9A depicts a cross-sectional view of the RSD structures after fabrication operations according to embodiments of the invention.

FIG. 9A depicts a cross-sectional view of the wafer structure 300 after fabrication operation according to one or more embodiments of the invention. As illustrated in FIG. 9A, the hard mask 412 pattern can be transferred to the underlying first layer 408 and second layer 410 of the top electrode 420. The first layer 408 and second layer 410 of the top electrode 420 can be patterned using, for example, a wet etch, a dry etch, or a combination of wet and/or dry etches. In some embodiments of the invention, the first layer 408 and second layer 410 of the top electrode 420, are patterned using a ME. In this manner, a top surface of the dielectric layer 406 is exposed.

In some embodiments of the invention, this etching process results in a recessing (partial etch) of the hard mask 412. In some embodiments of the invention, the hard mask 412 will be recessed about 40 nm during the top electrode 420 etch. In some embodiments of the invention, an oxide break-through step is used prior to etching the top electrode 420.

Still referring to FIG. 9A, the charge particle treatment is provided to the first layer of the top electrode 420 while the dielectric 406 remains over the structure. During the charge particle treatment, the electrons of the dielectric layer 406 become charged, and filaments will be partially formed in the dielectric layer 406 due to the large antenna ratio that exists between the bottom electrode 404 and top electrode 420. The charge particle treatment (represented by the symbol 902) can include but is not limited to using inductively coupled plasma (ICP), capacitively coupled plasma (CCP), and microwave generated plasma. In other embodiments of the invention, the charge particle treatment can include electron showers. In addition, the gases that can be used in the charged particle treatment can include but is not limited to Ar, N2, H2, He, Xe, NH3 and their mixture.

Figure 9B:
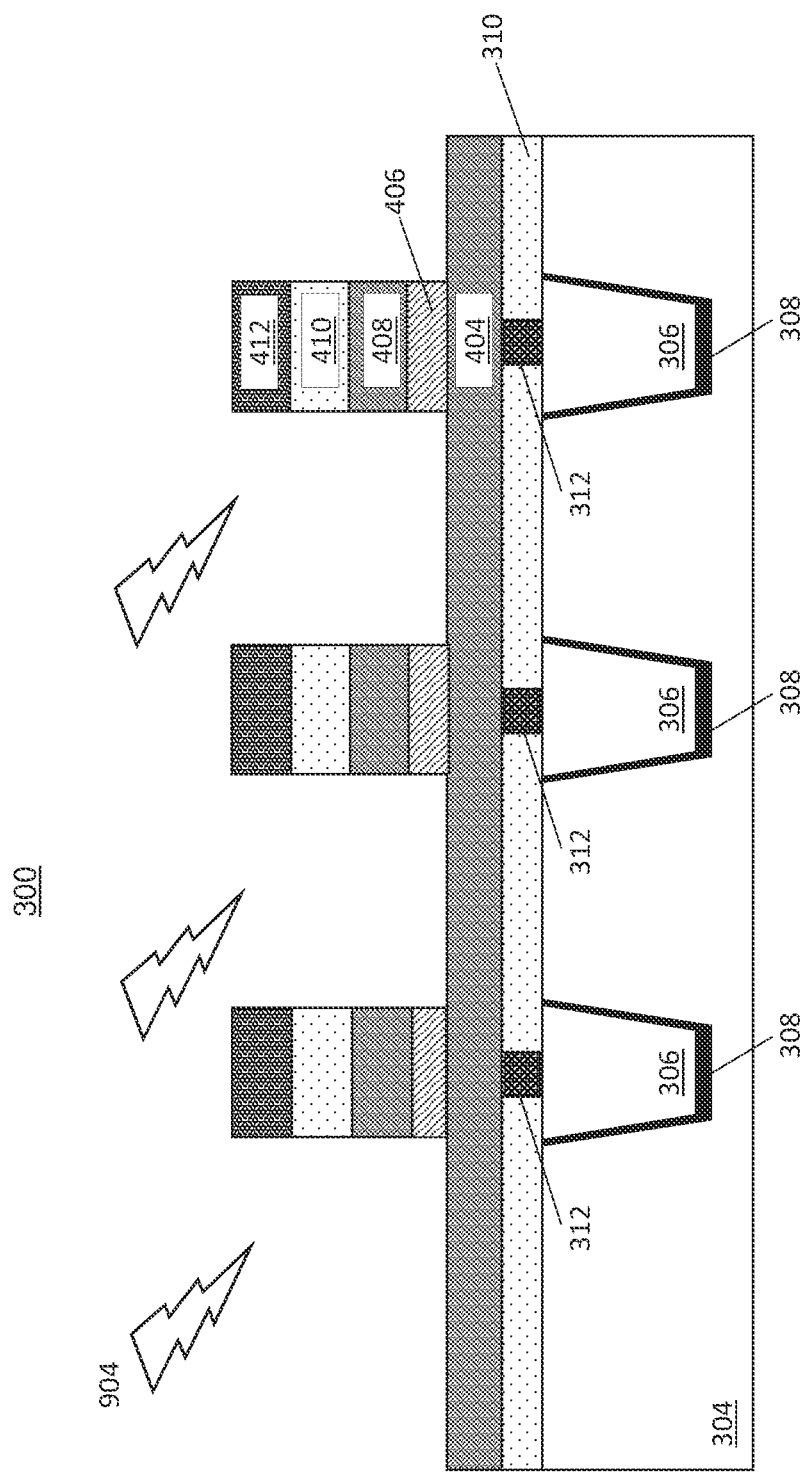
FIG. 9B depicts a cross-sectional view of the RSD structures after fabrication operations according to embodiments of the invention.

FIG. 9B depicts the structure 300 after performing one or more processes in accordance with one or more embodiments of the invention. As shown in FIG. 9B, the dielectric layer 406 has been etched and the charged particle treatment (represented by the symbol 904) has been performed on the exposed regions of the structure 300 including the bottom electrode 404. The larger bottom electrode 404 provides a larger surface area for the charge particle treatment. This enables an increased number of charged particles on the bottom electrode 404 when compared to the process of FIG. 9A. In one or more embodiments of the invention, the process conditions for the charge particle treatment processes 902 and 904 can include the same process conditions.

By performing the charged particle exposure to one or more layers of the memory stack the forming voltage for the memory stack is reduced. In addition, the patterning using the techniques described herein provide a very large ratio between the size of the metal interconnect electrode 312 and the top electrode 420 and bottom electrodes 404 of the memory stack. In one or more embodiments of the invention, the Pad/RRAM area ratio can be >(greater than) 1000. It should be understood the ratio can be different than that described herein and is not intended to be limiting by the previous example.

FIG. 10 depicts a cross-sectional view of the wafer structure 300 after fabrication operation according to one or more embodiments of the invention. As illustrated in FIG. 10, the bottom electrode 404 has been etched (where the etch process is represented by the arrows 1010). Any known etching processes can be used to remove one or more portions of the bottom electrode 404.

Figure 11:
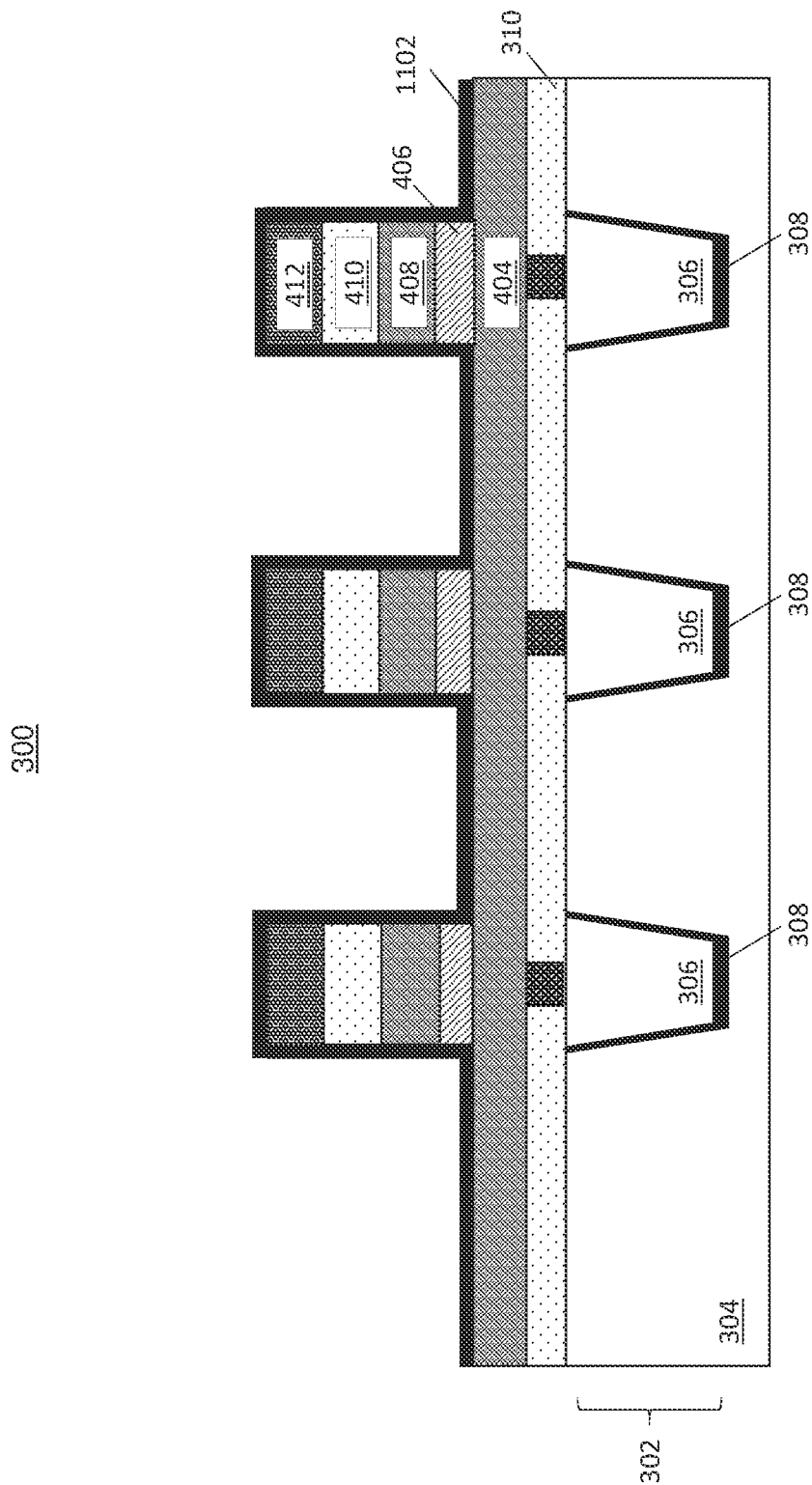

FIG. 11 depicts a cross-sectional view of the wafer structure 300 after fabrication operations according to one or more embodiments of the invention. As illustrated in FIG. 11, a spacer layer 1102 (also referred to as an encapsulation layer) can be formed on the bottom electrode 404 and the hard mask 412.

In some embodiments of the invention, the spacer layer 1102 is formed using CVD, PECVD, UHVCVD, RTCVD, MOCVD, LPCVD, LRPCVD, ALD, PVD, chemical solution deposition, or other like process. For example, spacer material can be directionally, conformally, or bulk deposited over exposed surfaces of the wafer structure 300.

In some embodiments of the invention, the spacer layer 1102 is conformally deposited over sidewalls of the hard mask 412, the first layer 408 and second layer 410 of the top electrode 420, and the dielectric layer 406 using, for example, ALD, although other conformal deposition processes are within the contemplated scope of the invention. The spacer layer 1102 can be made of any suitable dielectric material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The spacer layer 1102 can be formed to a nominal (conformal) thickness of about 30 nm or less, or 5 nm or less, although other thicknesses are within the contemplated scope of the invention.

Figure 12:
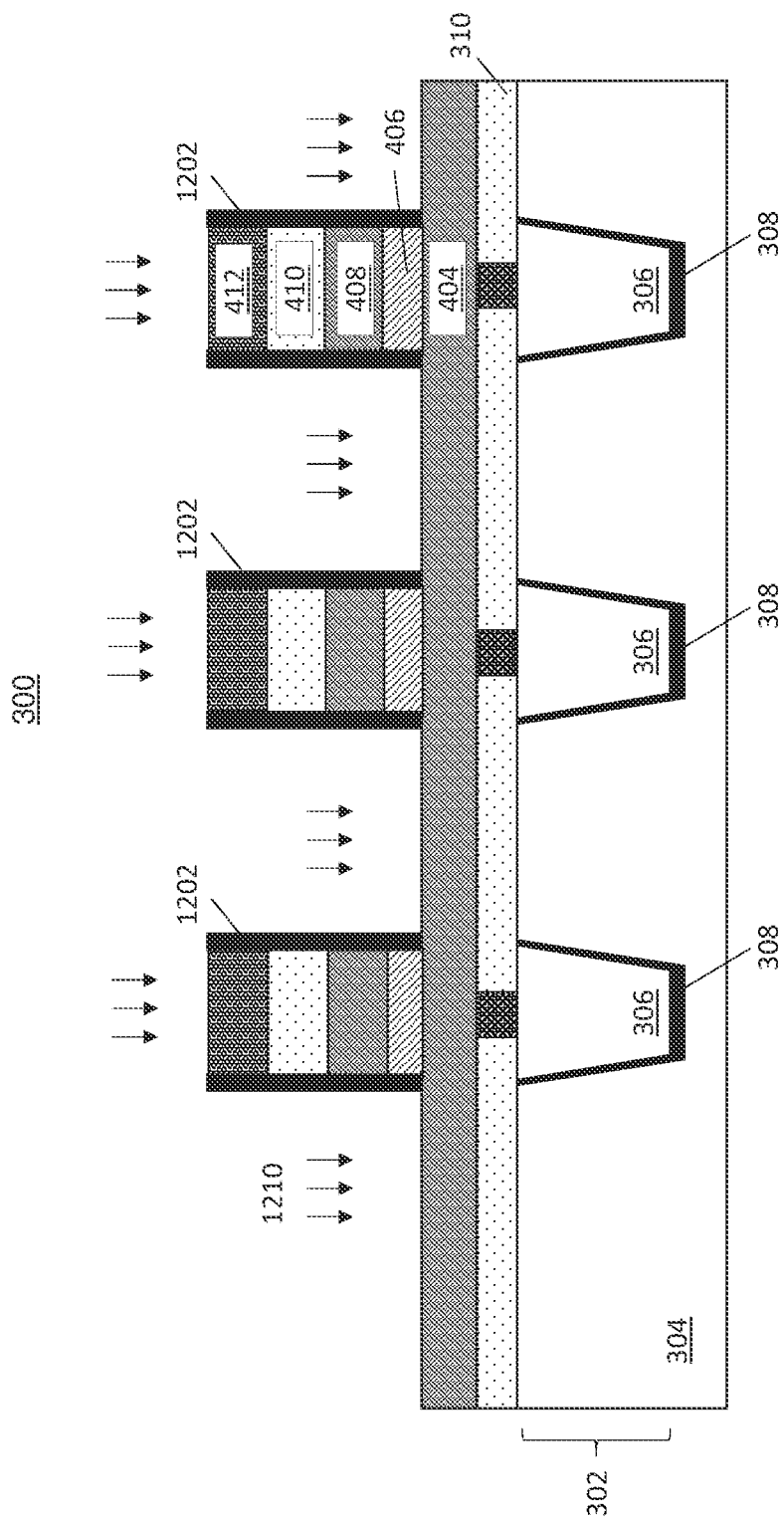

FIG. 12 depicts a cross-sectional view of the wafer structure 300 after fabrication operations according to one or more embodiments of the invention. As illustrated in FIG. 12, portions of the spacer layer 1102 can be removed using an etch process represented by arrows 1210, such that remaining portions of the spacer layer 1102 define one or more spacers 1202.

The spacer layer 1102 can be partially removed using, for example, an etch back process, to expose a surface of the bottom electrode 404 and the hard mask 412. In some embodiments of the invention, the spacer layer 1102 is etched selective to the bottom electrode 404 and/or the hard mask 412.

Figure 13:
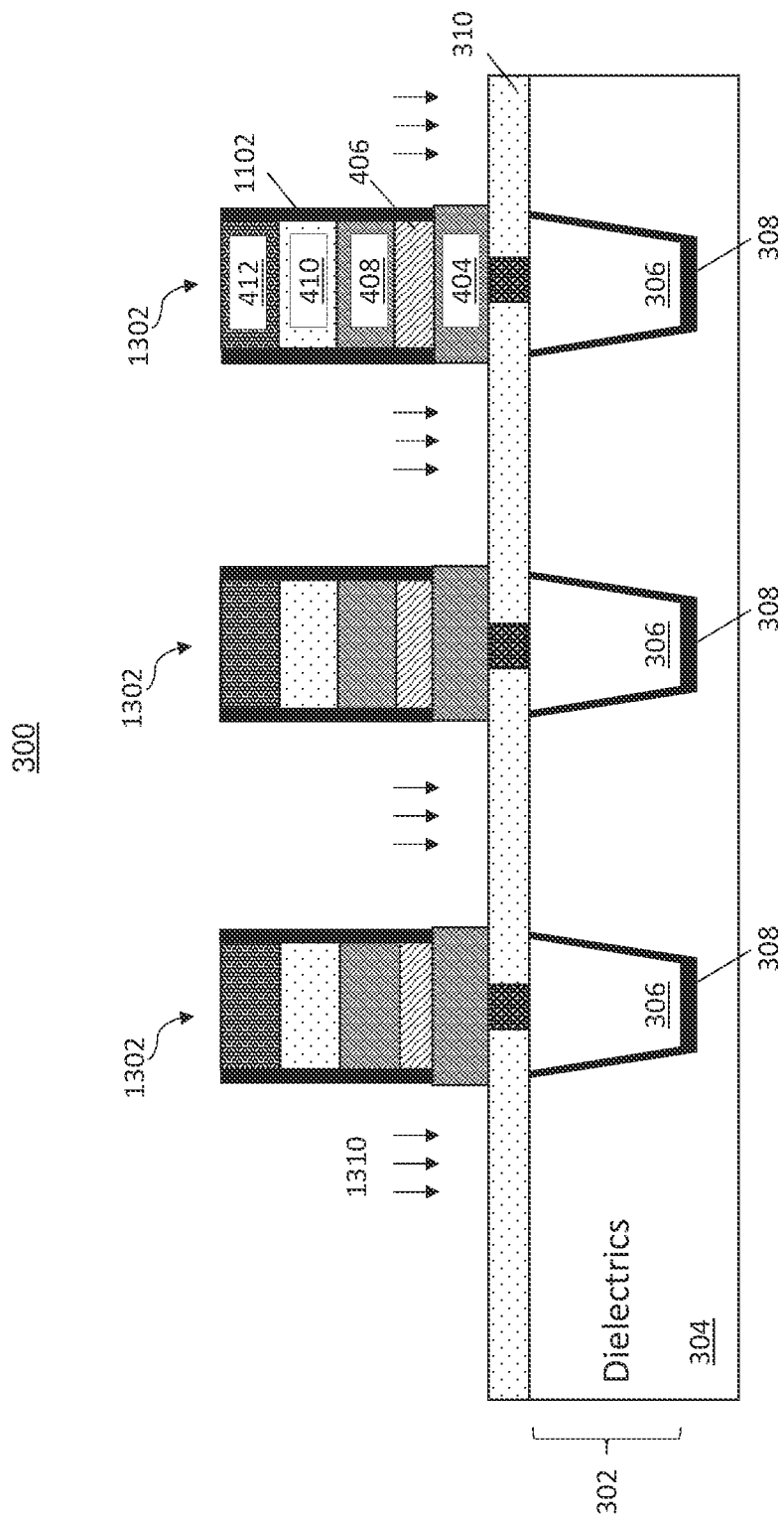

FIG. 13 depicts a cross-sectional view of the wafer structure 300 after fabrication operations according to one or more embodiments of the invention. As illustrated in FIG. 13, exposed portions of the bottom electrode 404 can be removed to define one or more RRAM elements 1302. In some embodiments of the invention, the exposed portions of the bottom electrode 110 are removed using a dry etch (represented by arrows 1310), without introducing any wet etch processes to the clean surface of the RRAM elements 1302.

As depicted in FIG. 13, each of the RRAM element(s) 1302 includes a patterned portion of the hard mask 412, the first layer 408 and the second layer 410 of the top electrode 420, the dielectric layer 406, the bottom electrode 404, and the spacers 1202. As discussed previously herein, the spacers 1202, formed on sidewalls of the top electrode 420, prevent a short between the top electrode 420 and the bottom electrode 404. In one or more embodiments of the invention, the hard mask 412 can be removed or etched to form a via to allow a top contact (not shown) to be formed on the top electrode 420.

Figure 14:
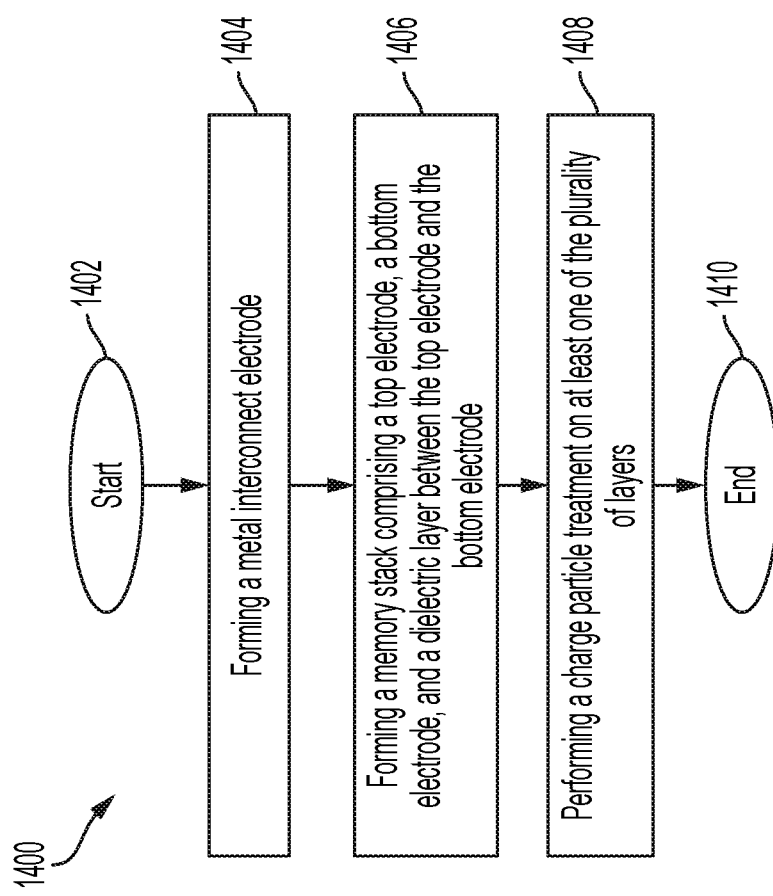
FIG. 14 depicts a flow diagram illustrating a method according to one or more embodiments of the invention.

FIG. 14 depicts a flowchart of a method 1400 for fabricating a semiconductor device in accordance with one or more embodiments of the invention. The method 1400 begins at block 1402 and proceeds to block 1404 which provides for forming a metal interconnect electrode. The metal interconnect electrode can be formed in a similar manner as the metal interconnect electrode depicted in FIG. 3.

Block 1406 forms a memory stack including a plurality of layers, wherein the plurality of layers includes a top electrode, a bottom electrode, and a dielectric layer between the top electrode and the bottom electrode. The memory stack can be formed in a similar manner as the stack depicted in FIG. 11. In some embodiments of the invention, the memory stack is formed on a surface of a metal interconnect layer. In some embodiments of the invention, the metal interconnect layer is formed in an inter-level dielectric over a substrate.

Block 1408 performs a charge particle treatment on at least one of the plurality of layers of the memory stack. The charge particle treatment of at least one of the layers reduces the forming voltage of the memory element which increases the ability to further scale the memory elements. The charge particle treatment can be performed in a similar manner as that shown in FIG. 9A or 9B. The method 1400 ends at block 1410. It should be understood the method 1400 is not intended to limit the scope and different steps or additional steps can be incorporated into the method 1400.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a resistive switching device, the method comprising:
    forming a metal interconnect electrode;
    forming a memory stack comprising a plurality of layers, wherein the plurality of layers includes a top electrode, a bottom electrode, and a dielectric layer between the top electrode and the bottom electrode;
    wherein forming the memory stack comprises forming a blanket bottom electrode layer then removing portions of the blanket bottom electrode layer; and
    forming current-conducting filaments of the memory stack by performing a charge particle treatment on at least one of the plurality of layers of the memory stack while a portion of the blanket bottom electrode is exposed.

2. The method of claim 1, wherein:
    the metal interconnect electrode comprises a first size dimension;
    the memory stack comprises a second size dimension and is formed on the metal interconnect electrode; and
    a ratio of the second size dimension to the first size dimension is greater than 1000.

3. The method of claim 2, wherein:
    the metal interconnect electrode is formed on a surface of a metal interconnect layer; and
    the metal interconnect layer is formed in an inter-level dielectric over a substrate.

4. The method of claim 1, wherein a filament forming voltage of the memory stack is reduced by forming the current-conducting filaments of the memory stack by performing a charge particle treatment on at least one of the plurality of layers of the memory stack.

5. The method of claim 4, further comprising:
    etching the top electrode of the memory stack;
    performing charge particle treatment on the top electrode of the memory stack; and
    etching the dielectric layer and bottom electrode.

6. The method of claim 4, further comprising:
    etching the top electrode of the memory stack;
    etching the dielectric layer; and
    performing the charge particle treatment on the bottom electrode of the memory stack.

7. The method of claim 1, wherein the bottom electrode, the dielectric layer, and the top electrode define a Resistive Random Access Memory (RRAM) device memory stack.

8. A method of fabricating a resistive switching device, the method comprising:
    forming a bottom electrode, wherein forming the bottom electrode comprises forming a blanket bottom electrode layer then removing portions of the blanket bottom electrode layer;
    forming a memory stack comprising a plurality of layers, wherein the plurality of layers includes a top electrode, the bottom electrode, and a dielectric layer between the top electrode and the bottom electrode;
    forming current-conducting filaments of the memory stack by performing a charge particle treatment on at least one of the plurality of layers of the memory stack while a portion of the blanket bottom electrode is exposed; and
    forming a spacer on a sidewall of at least a portion of the memory stack, wherein the spacer prevents a short between the top electrode and the bottom electrode while the portion of the blanket bottom electrode is exposed.

9. The method of claim 8, wherein:
    the memory stack is formed on a metal interconnect electrode;
    the metal interconnect electrode comprises a first size dimension;
    the memory stack comprises a second size dimension; and
    a ratio of the second size dimension to the first size dimension is greater than 1000.

10. The method of claim 9, wherein:
    the metal interconnect electrode is formed on a surface of a metal interconnect layer; and
    the metal interconnect layer is formed in an inter-level dielectric over a substrate.

11. The method of claim 8, wherein a filament forming voltage of the memory stack is reduced by forming the current-conducting filaments of the memory stack by performing a charge particle treatment on at least one of the plurality of layers of the memory stack.

12. The method of claim 8, further comprising:
etching the top electrode of the memory stack;
performing the charge particle treatment on the top electrode of the memory stack; and
etching the dielectric layer and bottom electrode.

13. The method of claim 8, further comprising:
etching the top electrode of the memory stack;
etching the dielectric layer; and
performing the charge particle treatment on the bottom electrode of the memory stack.

* * * * *